United States Patent [19]

Miyazawa

[11] Patent Number: 5,075,640
[45] Date of Patent: Dec. 24, 1991

[54] PHASE LOCKED LOOP CIRCUIT RESPONDING TO SUPPLIED SIGNAL FREQUENCY

[75] Inventor: Yuichi Miyazawa, Yokohama, Japan
[73] Assignee: Kabushiki Kaisha Toshiba, Kawasaki, Japan
[21] Appl. No.: 665,248
[22] Filed: Mar. 6, 1991

[30] Foreign Application Priority Data

Mar. 9, 1990 [JP] Japan ................................. 2-56432

[51] Int. Cl.$^5$ ............................................. H03L 7/00
[52] U.S. Cl. ....................................... 331/10; 331/25; 331/34
[58] Field of Search ....................... 331/10, 25, 34, 57

[56] References Cited

U.S. PATENT DOCUMENTS 4,988,960  1/1991  Tomisawa ........................ 331/25 X Primary Examiner—Robert J. Pascal
Attorney, Agent, or Firm—Finnegan, Henderson, Farabow, Garrett, and Dunner

[57] ABSTRACT

A phase locked loop circuit, which is arranged for receiving a first signal having a given frequency and producing a second signal which has the same frequency and is synchronous with the first signal, comprises control voltage generating means for generating a control voltage responding to a phase difference and a frequency difference between the first and second signals, a voltage controlled oscillator containing a ring oscillator having a multiplicity of the rows of inverters for producing a frequency output which is primarily determined by the control voltage, and a quantity-of-rows changing means for automatically changing the quantity of the inverters rows in the ring oscillator according to the control voltage.

18 Claims, 16 Drawing Sheets

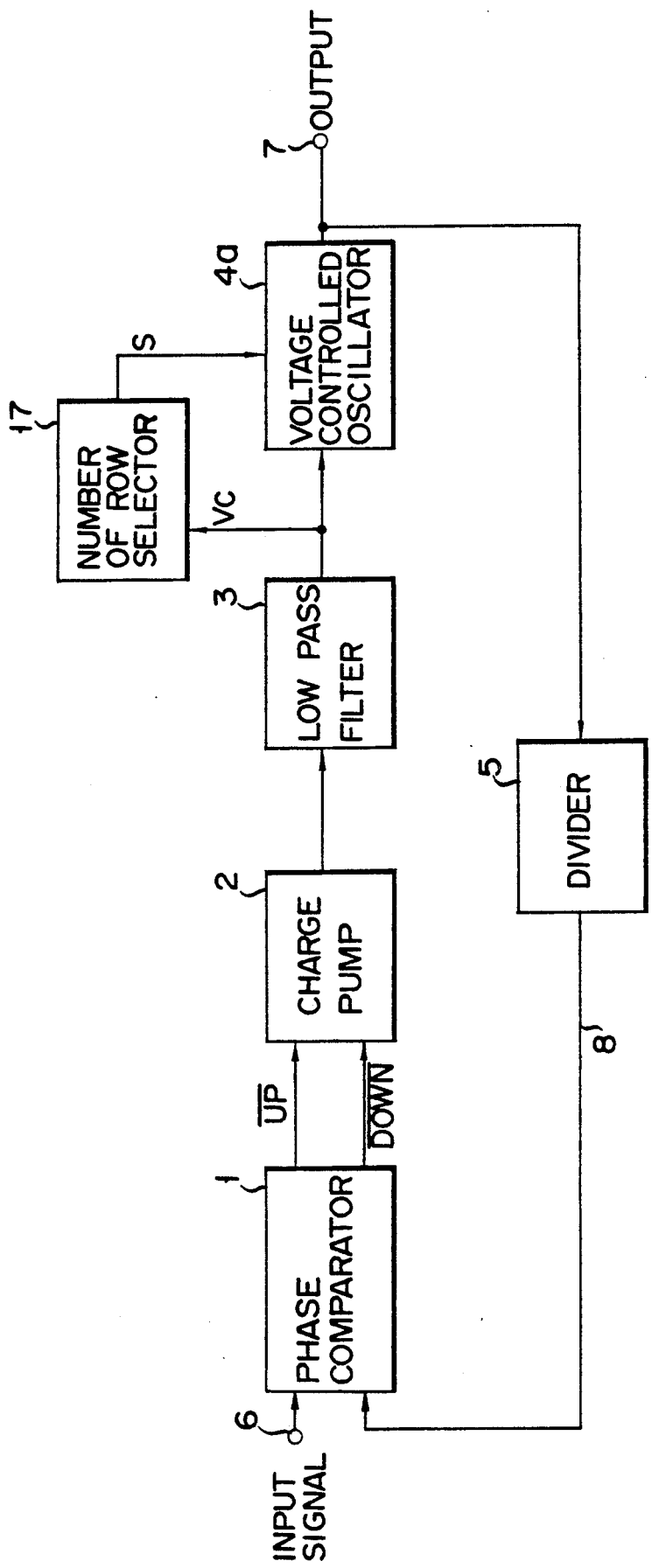
F I G. 1

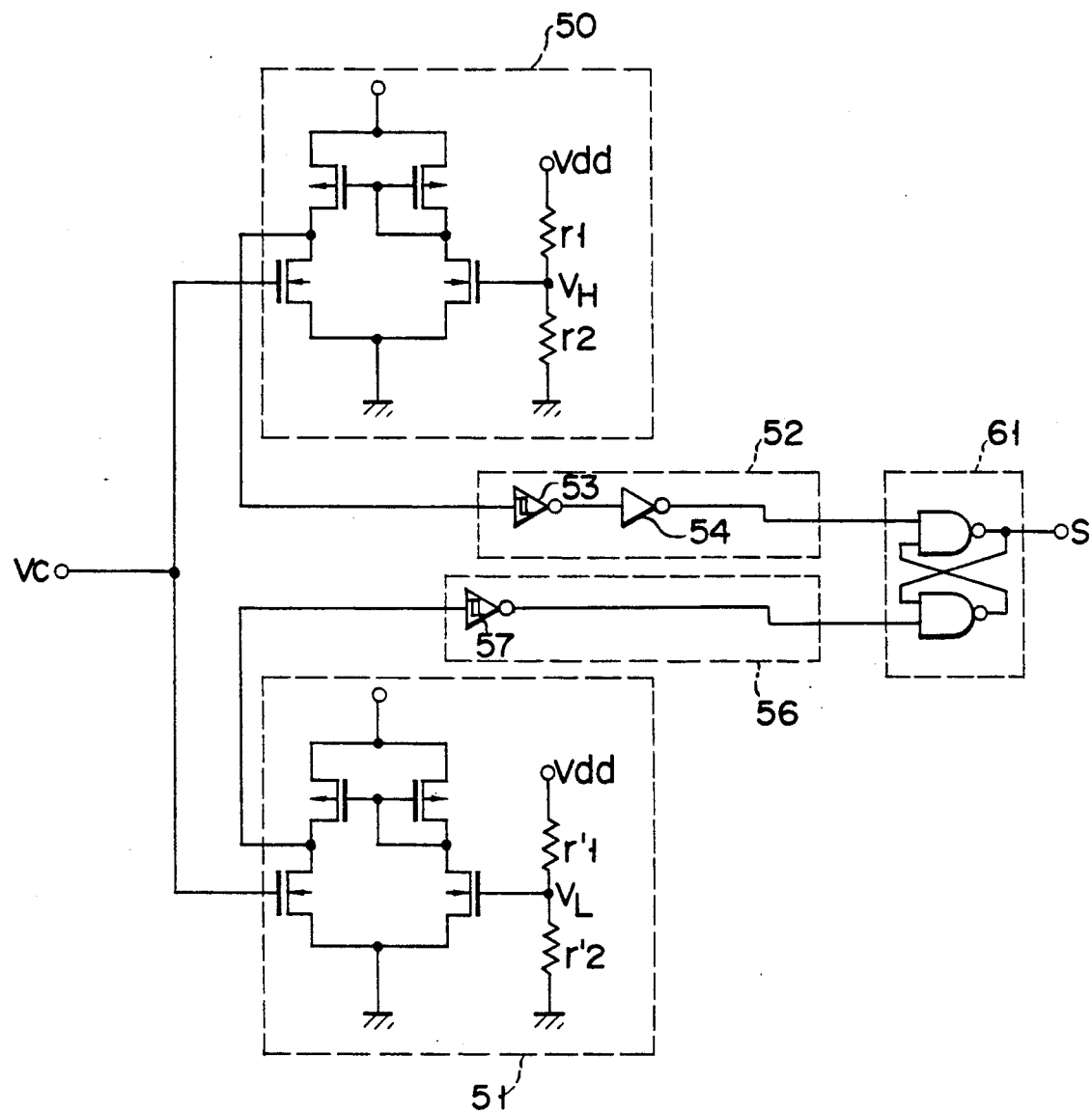
F I G. 3

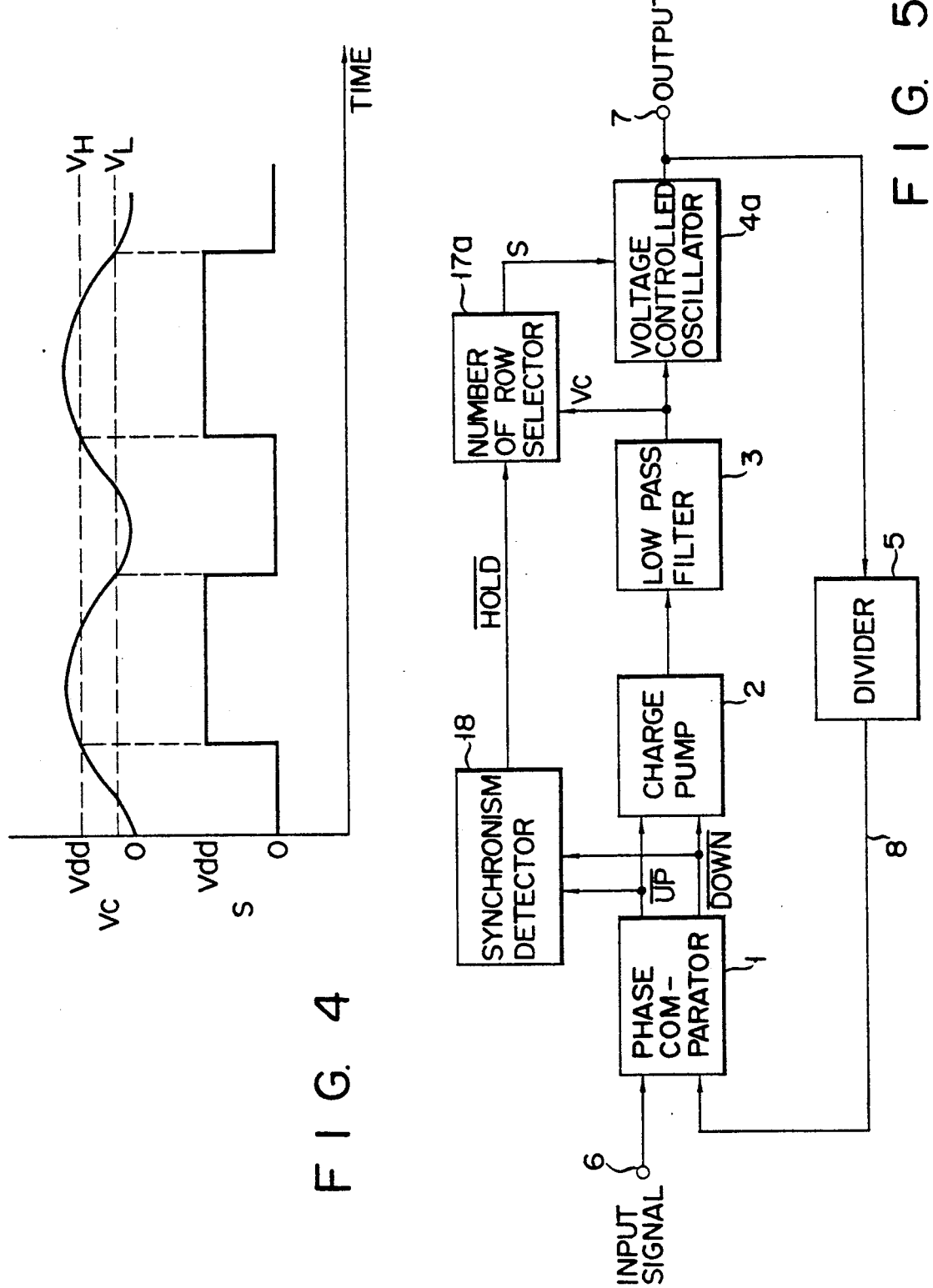

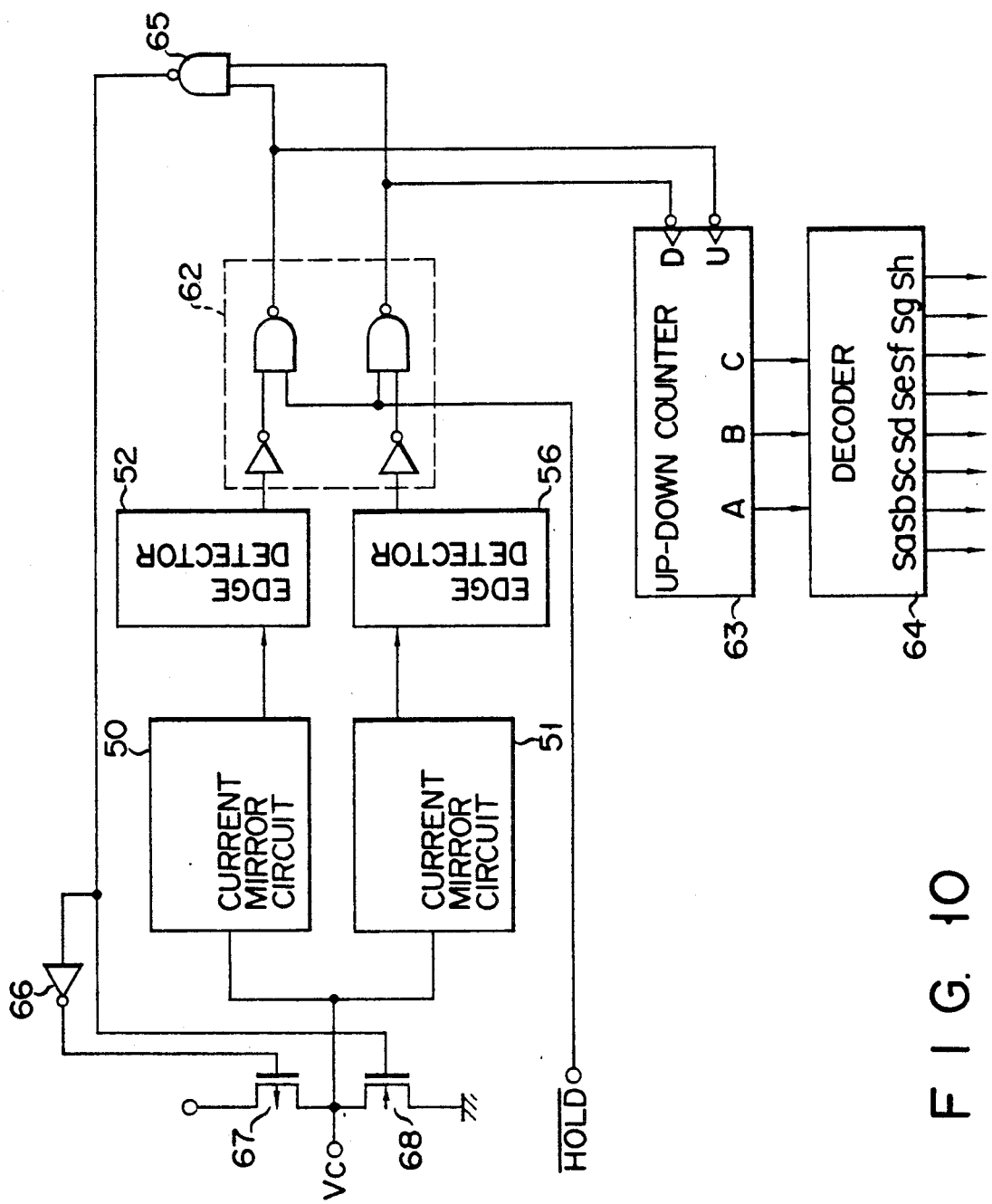
F I G. 10

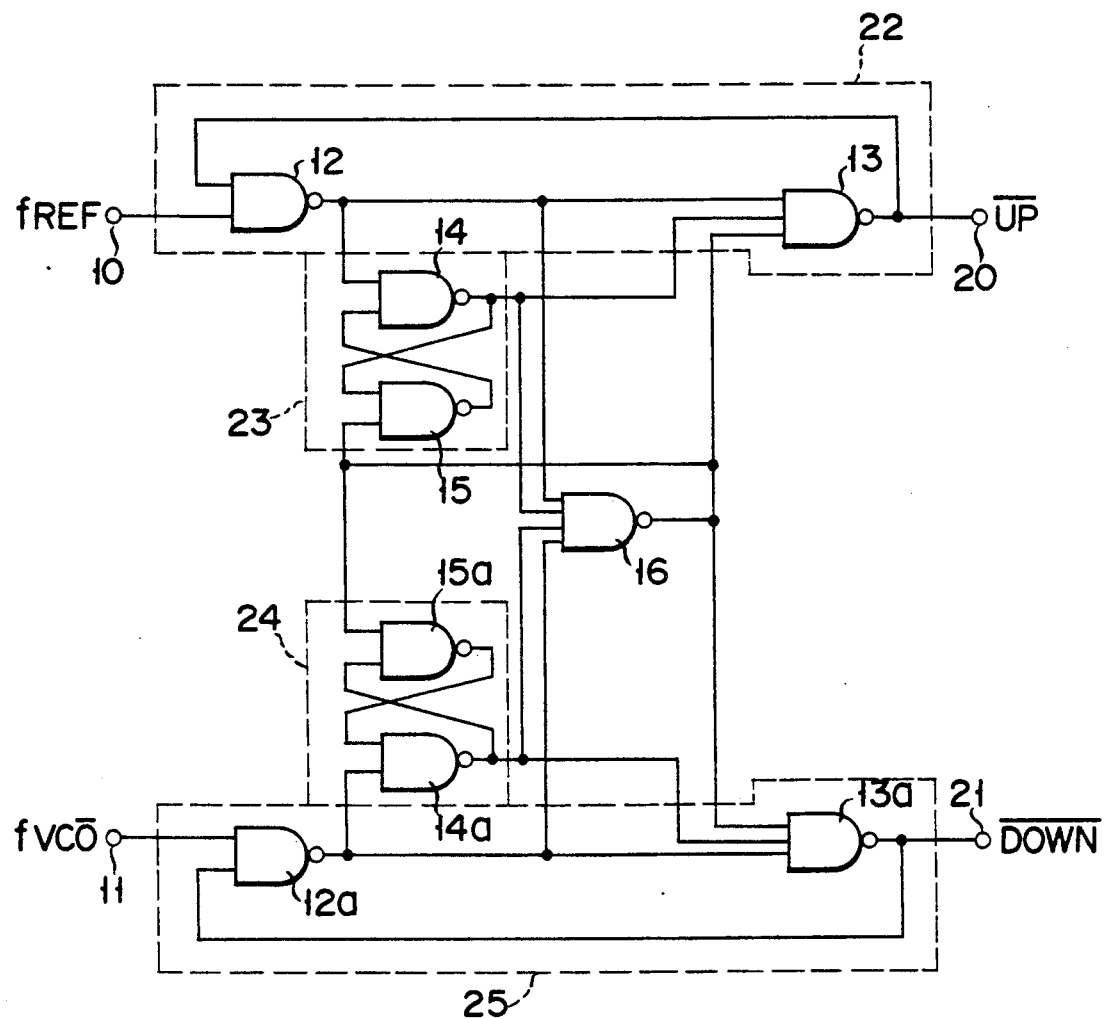
F I G. 12

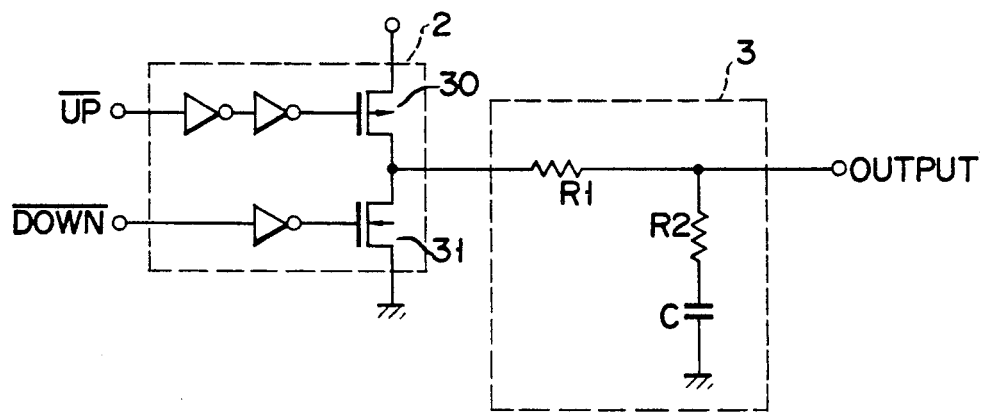
F I G. 13
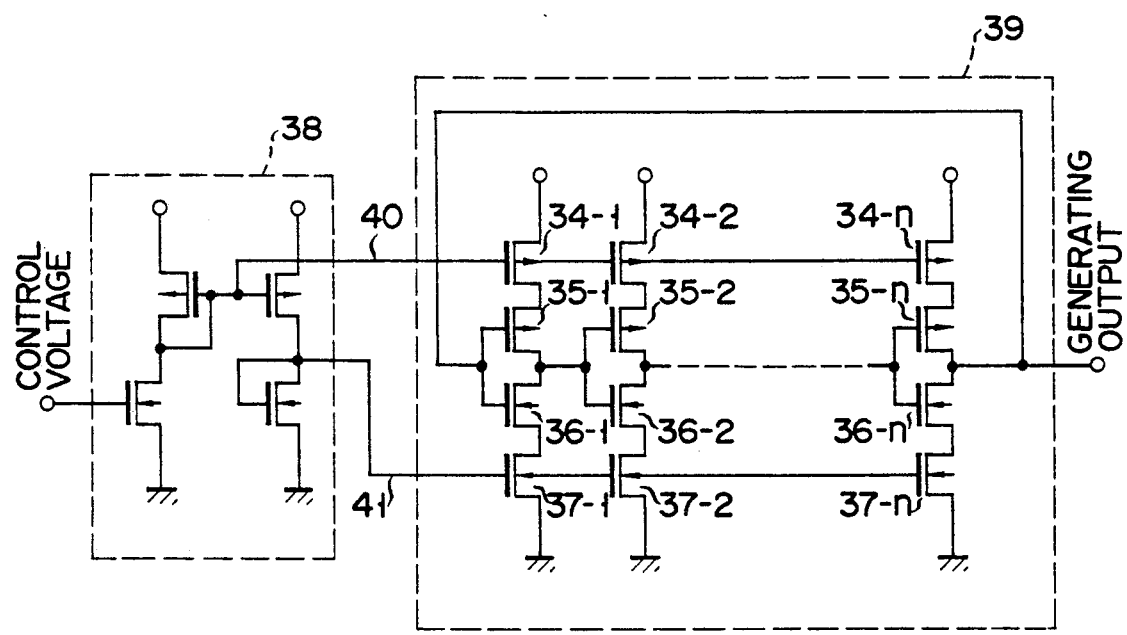
n: ODD NUMBER
F I G. 14

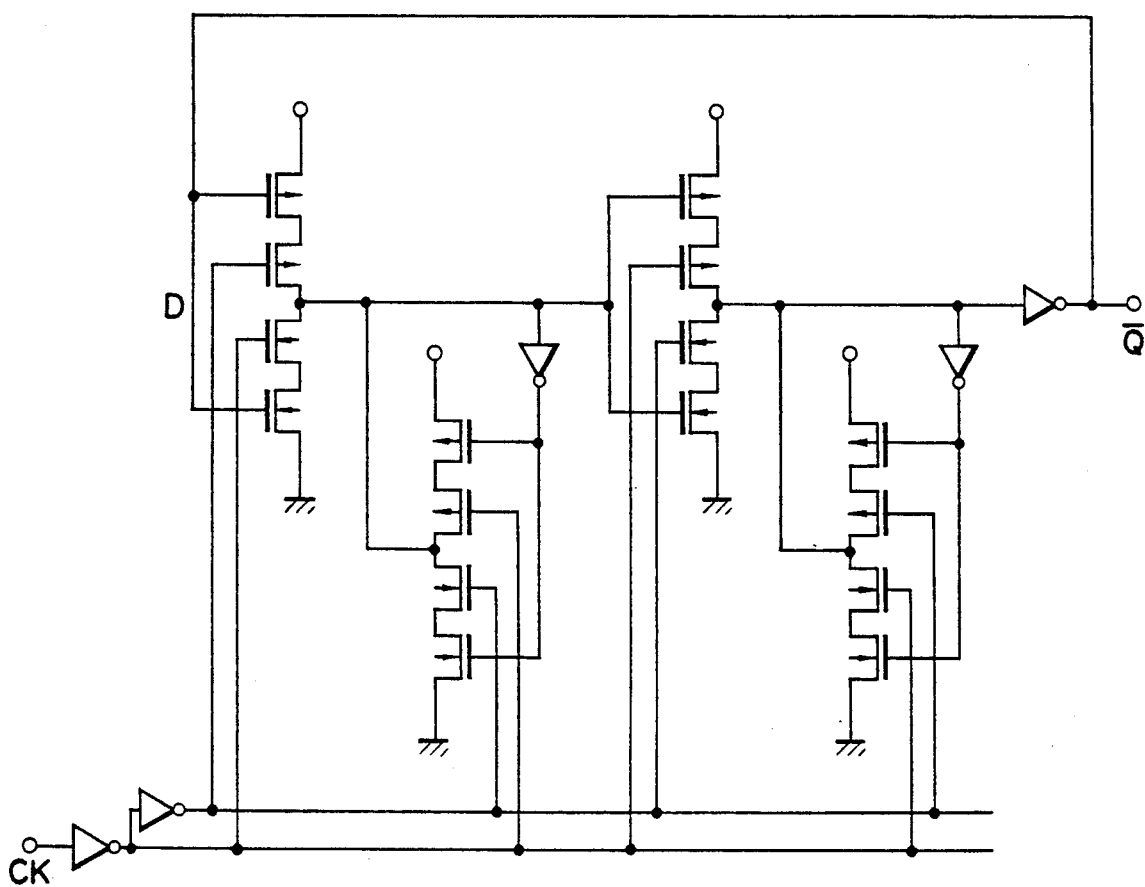
F I G. 15

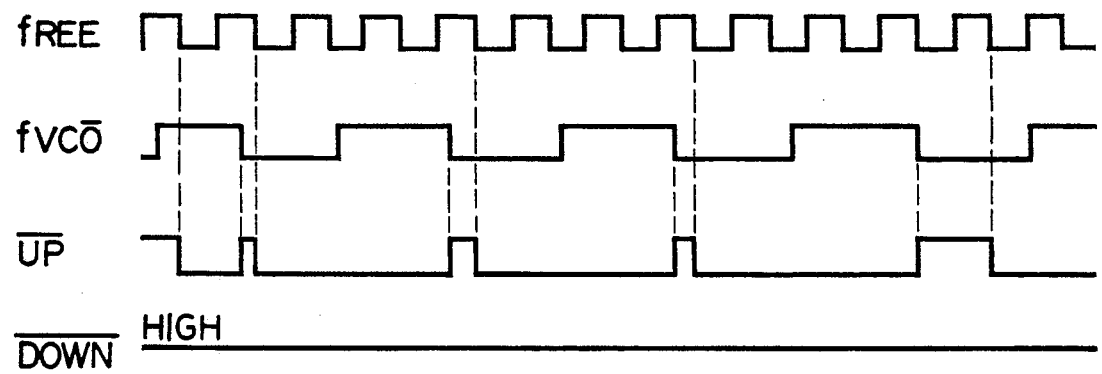
F I G. 16
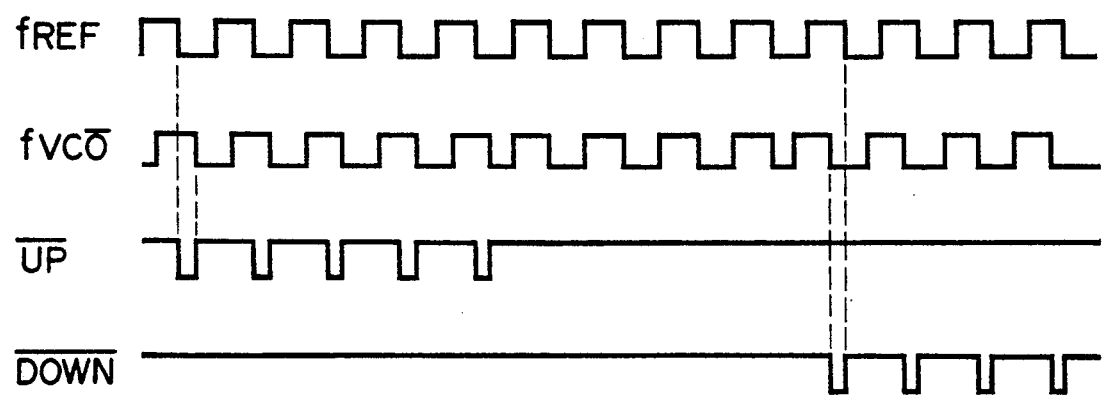
F I G. 17

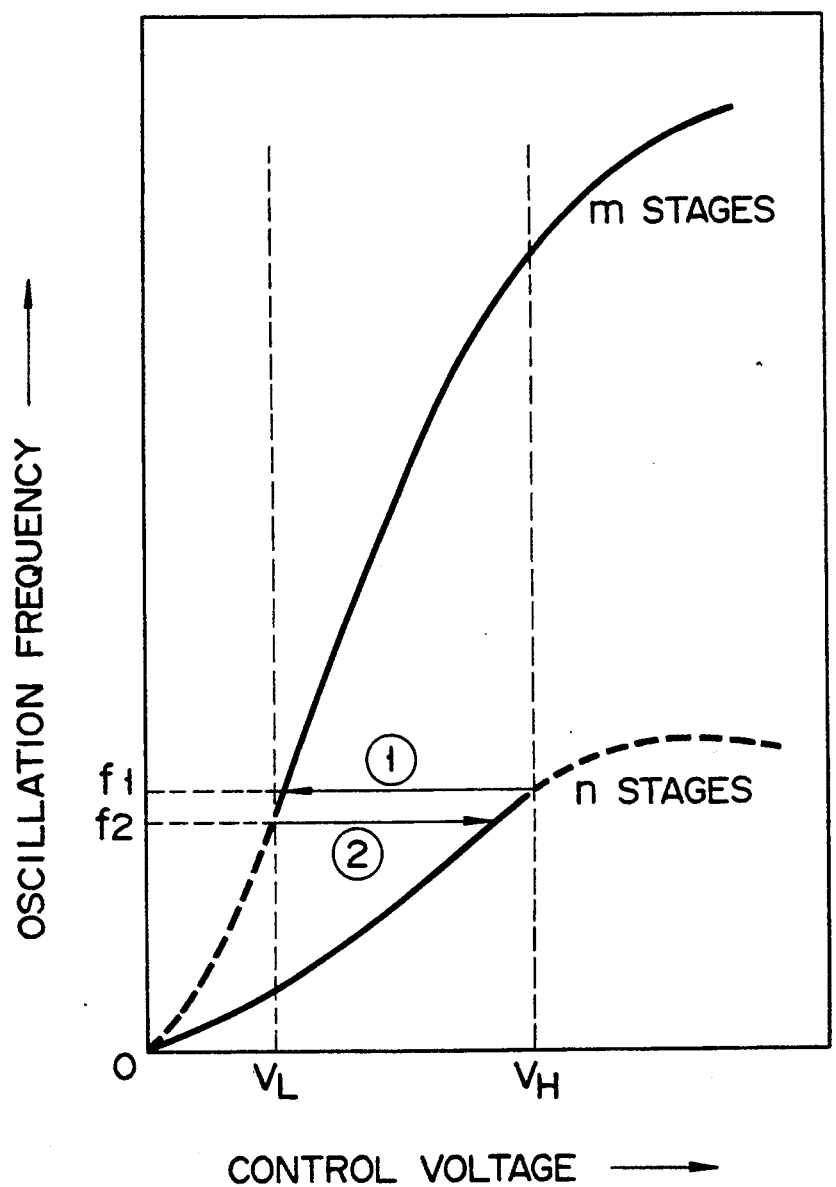
F I G. 18

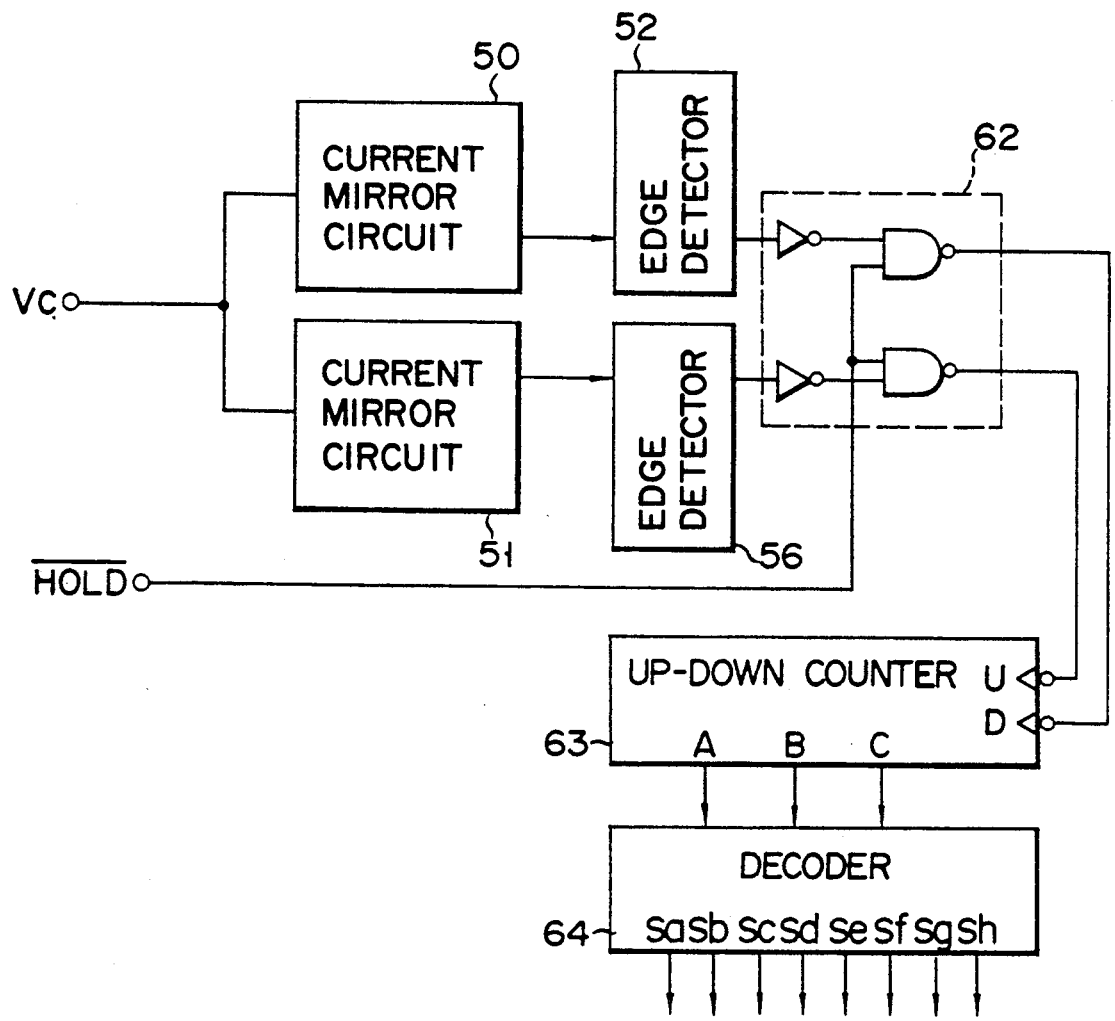
F I G. 20

PHASE LOCKED LOOP CIRCUIT RESPONDING TO SUPPLIED SIGNAL FREQUENCY

BACKGROUND OF THE INVENTION

1. Field of the Invention

A phase locked loop circuit is commonly arranged for comparing the oscillator frequency and phase of a voltage controlled oscillator with a reference signal in a phase comparator and with the use of a resultant output from the phase comparator, controlling an oscillator output from the voltage controlled oscillator to coincide in phase and frequency with the reference signal. The present invention relates to an improved phase locked loop circuit for enabling step multiplication of frequency in a semiconductor integrated circuit such as a microprocessor.

2. Description of the Related Art

A phase locked loop (referred to as a PLL hereinafter) according to the present invention is commonly incorporated in a semiconductor integrated circuit for subject to a pulse waveform and its principles will be no further explained in this description. The principles of PLL is described in more detail in "Phase lock Techniques" F. M. Gardner Second ed., by John Wiley & Sons N.Y. in 1979.

A prior art which is most closely associated with the present invention will then be described referring to FIGS. 11 to 15. FIG. 11 is a block diagram showing a basic PLL circuit in which the oscillator output is a pulse waveform having a frequency which equals two times that of the reference signal. There are provided a phase comparator 1 of a type best shown in FIG. 12, a charge pump 2, a lowpass filter 3, both being arranged in common as shown in FIG. 13, a voltage controlled oscillator 4 of ring oscillator type shown in FIG. 14, and a divider 5 commonly containing a D-type flip-flop as shown in FIG. 15. Also, a similar PLL is disclosed in "Design of PLL-based Clock Generation Circuits" by D. Jeong et al., an article in IEEE J. Solid-state circuits, vol. SC-22, NO. 2, April 1987, pp. 255 to 261.

The operation of the prior art PLL shown in FIG. 11 will now be described. The phase comparator 1 compares an output 8 of the divider 5 with a reference signal 6 and produces a pulse output corresponding to a phase difference between the two pulse waves. The charge pump 2 converts the pulse output into a current pulse which is in turn smoothed by the lowpass filter 3 to a DC voltage. The voltage controlled oscillator 4 generates oscillation at a given frequency corresponding to the current voltage. An oscillator output 7 is divided by the divider 5 into ½ frequency divider outputs which are then fed to the phase comparator 1.

In common, just after initial energization, the voltage controlled oscillator 4 remains not synchronized with the reference signal and produces oscillation at an arbitrary frequency not associated with the reference signal 6 (or if any, provides no oscillation). When the divider output 8 is lower in frequency than the reference signal, the phase comparator 1 delivers a low level pulse from an $\overline{UP}$ terminal thereof. As a result, the control voltage transmitted from the charge pump 2 and the lowpass filter 3 to the voltage controlled oscillator 4 is increased and thus, the frequency of oscillation will increase. On the other hand, when the divider output 8 is higher in frequency than the reference signal 6, the phase comparator 1 delivers a low level pulse from a $\overline{DOWN}$ terminal thereof. The low level pulse is then smoothed by the charge pump 2 and the lowpass filter 3 so that the control voltage to the voltage controlled oscillator 4 is attenuated. Thereby, the oscillation frequency will be declined.

As understood, when the frequency of the divider output 8 tends to deviate from the predetermined frequency of the reference signal 6, a negative feedback is induced. Accordingly, the divider output 8 remains oscillating at a frequency adjacent to that of the reference signal. The synchronization can be achieved by an appropriate loop gain in the entire PLL circuit and a time constant of the lowpass filter 3. Finally, a pulse wave having a frequency of 2 times that of the reference signal 6 will be delivered from the output 7 of the voltage controlled oscillator.

The components of the PLL shown in FIG. 11 will be described in more detail.

[Phase comparator]

The phase comparator illustrated in FIG. 12 is arranged to accept a reference signal $f_{REF}$ and a signal output $f_{VCO}$ of the voltage controlled oscillator (or the divider) and produce an output determined by comparing between the trailing edges of the two signals. If the decay of $f_{REF}$ comes earlier, a pulse is delivered from the $\overline{UP}$ terminal. If the decay of $f_{VCO}$ comes earlier, a pulse is supplied from the $\overline{DOWN}$.

FIG. 16 illustrates a timing chart in which the oscillation frequency $f_{VCO}$ (i.e. a frequency after the division) is lower than the reference signal $f_{REF}$. The $\overline{UP}$ terminal becomes a low level in response to the decay of $f_{REF}$ and remains at the low level until the decay of $f_{VCO}$ is detected. As $f_{VCO}$ is lower in frequency than $f_{REF}$, the $\overline{UP}$ is almost constantly held at the low level. On the contrary, the $\overline{DOWN}$ remains at a high level.

The phase comparator shown in FIG. 12 is arranged in symmetry for $f_{REF}$ and $f_{VCO}$. When $f_{VCO}$ is higher in frequency than $f_{REF}$, the $\overline{UP}$ and the $\overline{DOWN}$ come reversed from their states shown in FIG. 16; the $\overline{UP}$ remains at a high level and the $\overline{DOWN}$ remains at a low level. Hence, the states of both the $\overline{UP}$ and $\overline{DOWN}$ are determined by the high/low relation in frequency between two pulses having different frequencies regardless of phase difference so that the phase comparator acts as a frequency comparator. FIG. 17 shows a timing chart in which $f_{REF}$ and $f_{VCO}$ are nearly identical in frequency to each other and different in phase. A low level pulse having a time length corresponding to a time difference (phase difference) between the decays of $f_{REF}$ and $f_{VCO}$ passes either the $\overline{UP}$ or $\overline{DOWN}$ terminal. The operation of the phase comparator shown in FIG. 12 will now be described with respect to gate means.

The phase comparator contains four RS flip-flops 22, 23, 24 and 25 consisting of pairs of 2-input NAND gates 12 and 13, 12a and 13a, 14 and 15, and 14a and 15a respectively. A 4-input NAND 16 is thus assigned as a reset for the four RS flip-flops. The phase comparator is reset to an initial state when the 4-input NAND 16 delivers a low level pulse. At the time, the $\overline{UP}$ and $\overline{DOWN}$ terminals are also at high level. If both $f_{REF}$ and $f_{VCO}$ are held at high level, the outputs of the 2-input NANDs 12 and 12a are at low level and the outputs of the 2-input NANDs 14 and 14a are at high level.

At the initial state, the output of the 4-input NAND 16 is returned to a high level. Then, if $f_{REF}$ drops, for example, to a low level, the output of 2-input NAND 12 turns to high and the output of the 2-input NAND 13 (i.e. the UP terminal) turns to low. By now, three of four inputs to the 4-input NAND 16 are at a high level while the one from the 2-input NAND 12a is kept low. While f$_{VCO}$ remains high, a change in f$_{VCO}$ doesn't affect the phase comparator. In short, at the time, this circuit is waiting for variation of f$_{VCO}$.

When f$_{VCO}$ drops to a low level, the output of the 2-input NAND 12a turns to high. Hence, all the outputs of the 2-input NANDs 12, 12a, 14 and 14a are held at a high level and thus, the 4-input NAND 16 delivers a low level signal causing the RS flip-flops 22, 23, 24 and 25 to be reset. As the result, the $\overline{UP}$ is turned to a high level and the entire circuit will be returned to the initial state.

When f$_{VCO}$ is shifted to a low level from the initial state, the action will be just a reverse of the foregoing and no further described.

When both f$_{REF}$ and f$_{VCO}$ are simultaneously shifted from a high level in the initial state to a low level, the 4-input NAND 16 delivers a low level signal causing the circuit to be reset. Hence, the $\overline{UP}$ and $\overline{DOWN}$ terminals temporarily drop to the low level and then, return to the original high level. This momentary level shift results in a spike which can be eliminated by wave modulating the outputs of the $\overline{UP}$ and $\overline{DOWN}$ terminals. Accordingly, the coincidence of f$_{REF}$ and f$_{VCO}$ in phase and frequency allows the $\overline{UP}$ and $\overline{DOWN}$ outputs of the phase comparator to remain practically at a high level constantly.

[Charge pump + lowpass filter]

The charge pump 2 and the lowpass filter 3 will be described referring to FIG. 13. The charge pump 2 is arranged to actuate upon receiving two, $\overline{UP}$ and $\overline{DOWN}$, pulse signals from the phase comparator 1. When $\overline{UP}$ is low, a P-channel transistor 30 of the charge pump 2 is switched on to feed a current to the lowpass filter 3. When $\overline{DOWN}$ is low, an N-channel transistor 31 is turned on to transfer a current from the lowpass filter 3 towards the GND potential. When both $\overline{UP}$ and $\overline{DOWN}$ are at high level, the output of the charge pump 2 is kept in a high impedance state, hence no change of state for the lowpass filter 3. The current output from the charge pump 2 is smoothed in the low pass filter 3 to a control voltage which is supplied to the voltage controlled oscillator 4.

More specifically, the circuit arrangement shown in FIG. 13 will operate in the following manner. When the reference signal and the oscillator output (or a divider output) are quite different in frequency from each other, either $\overline{UP}$ or $\overline{DOWN}$ is almost constantly maintained to a low level, the charge pump feeds a current and the output of the lowpass filter 3 increases or decreases with a specific time constant (R1+R2) C. When the two frequencies of the reference signal and the oscillator output (or the divider output) become nearly equal to each other, a series of short pulses are applied at equal intervals of a time (a period in the reference signal) to the input of the charge pump 2 which in response produces a current pulse. Then, a pulse output voltage of the lowpass filter 3 is iR$_2$ where i is the magnitude of a current pulse.

This pulse is fed to the voltage controlled oscillator where the frequency is shifted by a given time equal to a time length of the pulse so that the phase difference is corrected. If R$_2$ is too small, the phase compensation will be less effective and hardly ensure stable oscillation. Also, if R$_2$ is too great, the pulse determined by iR$_2$ becomes excessively high and the phase compensation will be over the proper level, thus resulting in unstable oscillation. For the proper setting of R$_1$, R$_2$ and C refer to the book, "Phase lock Technique" described previously.

[Voltage controlled oscillator]

The voltage controlled oscillator will now be described referring to FIG. 14, which consists of a buffer amplifier 38 and a ring oscillator 39. The buffer amplifier 38 is arranged to produce upon receiving an output from the lowpass filter 3 a control voltage for supply to the ring oscillator 39. The output of the lowpass filter 3 is low in load driving capability and also, a couple of control lines 40 and 41 in between tend to accumulate noises resulting from switching movements of transistors 35 and 36 (more particularly, caused by the coupling capacitance between drain and gate). It is thus needed for providing the buffer amplifier 3 between the lowpass filter 3 and the ring oscillator 39.

The ring oscillator 39 is provided in which an odd number of functional rows (stages), each row consisting of an inverter composed of a P-channel transistor 35 and an N-channel transistor 36, a P-channel transistor 34 coupled to the P-channel transistor 35, and an N-channel transistor 37 coupled to the N-channel transistor 36, are aligned in the cascade arrangement. The output of the last row is coupled to the input of the first row. Both the P- and N-channel transistors 34 and 37 are varied in "on" resistance by the control voltage so that the switching delay in the inverter of the transistors 35 and 36 can change.

The oscillation in the ring oscillator is induced by transmission of a switching delay of the inverter and its cycle is determined by a duration in which the switching delay circulates 2 times in the ring oscillator. If the switching delay of the inverter is defined $\tau_a$ and the number of the inverter rows is n, the oscillating cycle is expressed as:

$$T = 2n\tau_a$$

Then, the oscillator frequency f is obtained from:

$$f = \frac{1}{2n\tau_a} \quad (1)$$

In general, the number n of the inverter rows is fixed and the oscillator frequency can be controlled by $\tau_a$. Hence, the ring oscillator 39 generates a higher rate of the oscillator frequency when the input voltage to the buffer amplifier 38 is increased and a lower rate when it is decreased.

[Divider]

The divider 5 will now be described referring to FIG. 15. The divider illustrated in FIG. 15 is substantially a D-type flip-flop in which a signal supplied to the port D is polarity inverted in response to the rise of a clock CK and transferred to the port $\overline{Q}$. Accordingly, through the feedback of $\overline{Q}$ output to D input, the $\overline{Q}$ output is polarity inverted corresponding to each rise in the clock CK. Although this action is associated with the division by 2, more cascade connections of the D flip-flop can be formed to realize division by n.

The phase locked loop circuit employing this ring oscillator, which is not associated with the present invention, will encounter a difficulty in the action if the range of the frequency of a reference signal input is wide.

When a high frequency reference signal is input, the ring oscillator should produce a high frequency output signal and thus, the period required for the cycle movement of a switching wave across the inverters needs to be shortened. For the purpose, a less number of inverter rows will be desired. If the inverter rows are provided in large number instead, in spite of rising of the control voltage, the period of cycling across the inverters becomes extended and inappropriate to the high frequency.

Also, when a low frequency of the reference signal is input, the period required for circulation of a timing signal within the ring oscillator becomes longer in order to produce a low frequency output corresponding to the low frequency reference signal input. In general, it is thus needed to increase the rows in the ring oscillator in quantity of inverters rows for low frequency.

However, in the foregoing arrangement having a reduced number of the rows for high frequency output, the only possible provision for lengthening the cycle of the oscillation is to increase a delay time in each inverter row of the ring oscillator. This causes a potential shift in the inverter at output slow and the inverter itself will thus show a tendency to draw an unnegligible amount of external noise and will be less stable in oscillation.

In addition, a ring-oscillator having little number of inverter rows tends to vary its oscillation frequency greater by a little change of control voltage than a ring-oscillator having large number of inverter rows.

Therefore, the former is more sensitive than the latter to the noise superposed on the control line.

It is now understood that more number of the rows in the ring oscillator are preferably employed for accepting low frequency input signals.

A problem still lies that the PLL having a ring oscillator of a given number of rows is unlikely to provide a good performance for the wide range of frequencies.

SUMMARY OF THE INVENTION

It is an object of the present invention to provide a PLL (phase locked loop) circuit capable of proper operation in response to the frequency of a supplied signal.

A phase locked loop circuit according to the present invention, arranged for receiving a first signal having a given frequency and producing a second signal which has the same frequency and is synchronous with the first signal, comprises: control voltage generating means 1, 2 and 3 for generating a control voltage $V_C$ responding to phase difference and a frequency difference between the first and second signals; a voltage controlled oscillator 4a containing a ring oscillator having multiple rows of inverters for producing a frequency output which is primarily determined by the control voltage $V_C$; and a number-of-rows changing means 17 to automatically change the number of the rows in the ring oscillator corresponding to the control voltage $V_C$.

Also, the present invention provides a phase locked loop circuit, which is arranged for receiving a first signal having a given frequency and producing a second signal which has the same frequency and is synchronous with the first signal, comprising: a phase comparator 1 for producing through comparing the first signal 6 with the second signal 8 fed back from the output a pulse of a phase difference signal between the first and second signals; a charge pump 2 for converting the phase difference signal pulse into a current pulse; a lowpass filter 3 for converting the current pulse into a DC voltage $V_C$; a voltage controlled oscillator 4a containing a ring oscillator 39 having an odd number of the inverter rows coupled in cascade for producing the second signal 8 having said frequency when receiving the control voltage $V_C$ with the inverters; and a number-of-rows selector 17 for automatically selecting a desired number of the rows in the ring oscillator 39 according to the control voltage $V_C$.

Accordingly, the arrangement of the present invention can act to produce the second signal 8 which is in phase with the first signal 6 and has a frequency identical to that of the first signal. More particularly, the control voltage generating means 1, 2 and 3 generates the control voltage $V_C$ responding to a phase difference and a frequency difference between the first signal 6 and the second signal 8 fed back from the output. Then, the voltage controlled oscillator 4a arranged in which the output frequency is primarily determined by the control voltage $V_C$ produces a second signal 8 having the same phase and frequency. The voltage controlled oscillator 4a provided with the ring oscillator consisting mainly of the rows of the inverters so that a more number of the inverter rows are involved for oscillation if the first signal has a low frequency and a less number of the same are involved if it has a high frequency.

For automatically changing the number of the inverter rows in the ring oscillator by means of the control voltage $V_C$ according to the high or low level of the frequency, the number of rows changing means 17 is arranged in the phase locked loop circuit of the present invention which thus can provide an optimum action with the use of the most appropriate number of the rows in the ring oscillator to an input frequency.

The control voltage generating means 1, 2 and 3 is preferably consisted of a phase comparator 1 for producing through comparing the first signal 6 with the second signal 8 fed back from the output pulse of a phase difference signal between the first and second signals, a charge pump 2 for converting the phase difference signal pulse into a current pulse, and a lowpass filter 3 for converting the current pulse into a DC voltage $V_C$.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram of a phase locked loop circuit showing a first embodiment of the present invention;

FIG. 3 is a circuit diagram showing a number-of-rows selector employed in the first embodiment portrayed in FIG. 1;

FIG. 4 is a timing chart showing the action of the number of rows selector shown in FIG. 3;

FIG. 5 is a block diagram of a phase locked loop circuit showing a second embodiment of the present invention;

FIG. 10 is a circuit diagram showing a number-of-rows selector employed in the third embodiment;

FIG. 12 is a circuit diagram showing a phase comparator employed in the background art PLL;

FIG. 13 is a circuit diagram showing a charge pump and a lowpass filter employed in the background art PLL;

FIG. 14 is a circuit diagram showing a voltage controlled oscillator employed in the background art PLL;

FIG. 15 is a circuit diagram showing a ½ divider employed in the background art PLL;

FIGS. 16 and 17 are timing charts showing the action of the phase comparator shown in FIG. 12;

FIG. 18 is a characteristic diagram showing the relation between oscillator frequency and control voltage in the voltage controlled oscillator of the first and second embodiments;

FIG. 20 is a block diagram showing a number-of-rows selector which is simpler in arrangement than that of the third embodiment of the present invention.

DETAILED DESCRIPTION OF THE PREFERRED EMBODIMENTS

Figure 2:
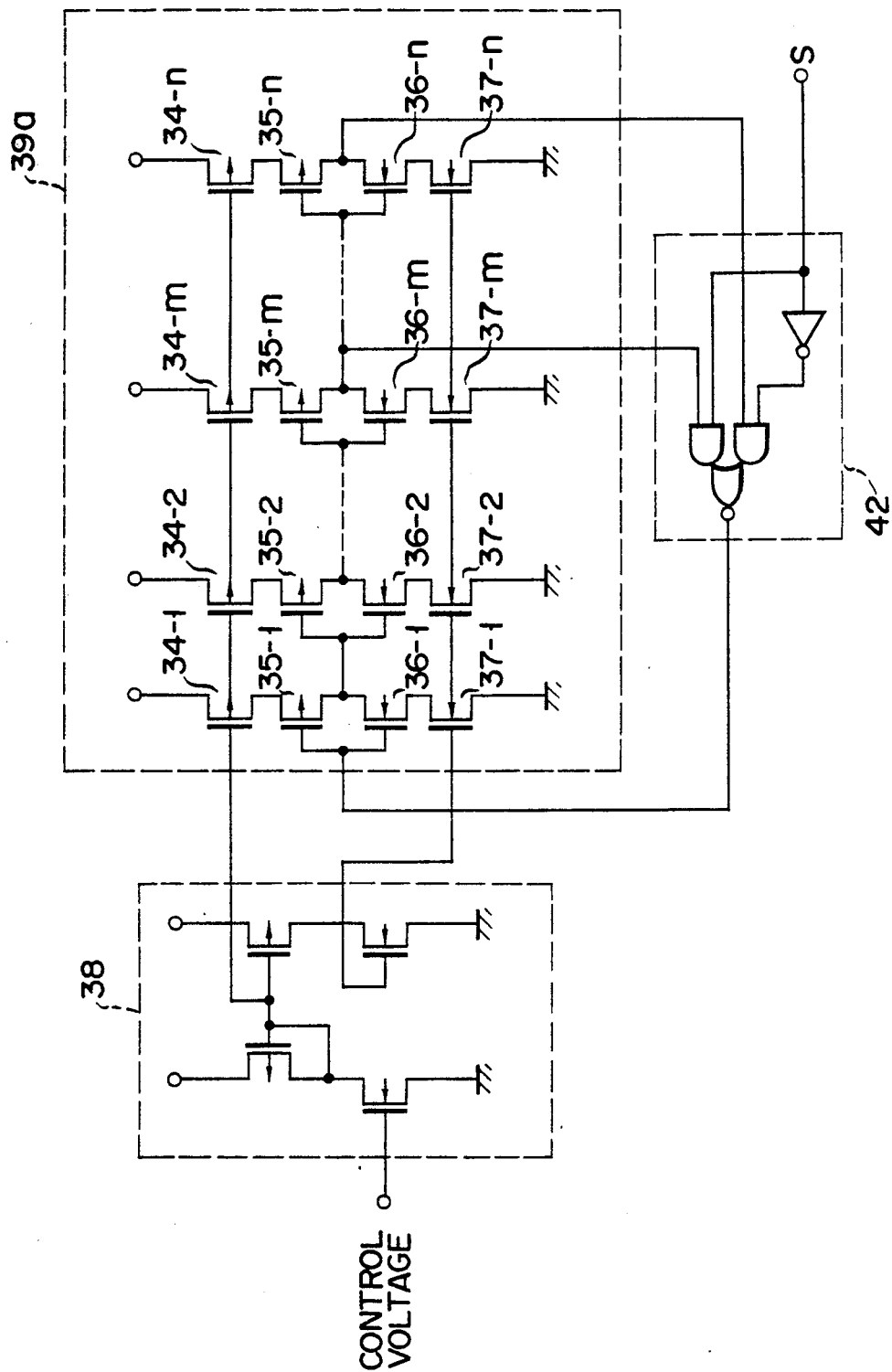
FIG. 2 is a circuit diagram showing a voltage controlled oscillator employed in the first embodiment portrayed in FIG. 1.

A first embodiment of the present invention will then be described referring to FIGS. 1 to 3. The first embodiment comprises a phase comparator 1 for comparison between a reference signal 6 and a divider output 8, a charge pump 2 for converting a pulse output of the phase comparator 1 into a current pulse, a lowpass filter 3 for smoothing the current pulse from the charge pump 2 to a control voltage for output, a voltage controlled oscillator 4a for oscillation at a frequency corresponding to the control voltage from the lowpass filter 3, a divider 5 for dividing an output 7 of the voltage controlled oscillator 4a, and a number-of-rows selector circuit 17 for selecting a number of the rows in a ring oscillator for oscillation control with the use of a control voltage $V_C$ from the lowpass filter 3.

In this embodiment, the phase comparator 1 is identical to a conventional one shown in FIG. 12. Similarly, the charge pump 2 and the lowpass filter 3 are equal to those shown in FIG. 13 and the divider 5 is that shown in FIG. 15. As shown in FIG. 2, the voltage controlled oscillator 4a contains a buffer amplifier 38, a ring oscillator 39a and a selector 42. The buffer amplifier 38 and the ring oscillator 39a are both equal in function to the buffer amplifier 38 and the ring oscillator 39a respectively shown in FIG. 14. The ring oscillator 39 illustrated in FIG. 14 is arranged in which the output of the inverter at the last row is directly coupled to the inverter of the first row. On the other hand, the ring oscillator 39a shown in FIG. 2 is arranged in which the output from either the last row (n-th row) or the m-th row is selectively supplied to the first row through selection with a selector 42.

When the input S is at high level, the selector 42 is actuated to couple the output of the m-th row with the input of the first row in the ring oscillator 39a which in turn generates oscillation as a m-stage ring oscillator. When the input S is at low level, the selector 42 couples between the output of the last row and the input of the first row in the ring oscillator 39a which thus generates oscillation as a n-stage ring oscillator.

The number m may be arbitrarily determined. If m = n/3, the frequency of oscillation of m rows is about three times that of the n rows. Accordingly, the n row mode of the ring oscillator 39a can be used for oscillation at a lower frequency and the m row mode for oscillation at a higher frequency.

The number of rows selector circuit 17 will now be described referring to FIG. 3. The number of rows selector circuit 17 is a circuit consisting of a pair of current mirror circuits 50 and 51 for potential comparison, two edge detectors 52 and 56 for shaping a waveform of the outputs from their respective current mirror circuits 50 and 51, and an RS flip-flop 61 for receiving the outputs from the two edge detectors 52 and 56. The reference potential in the current mirror circuit 50 is given by dividing a source voltage Vdd with the use of two resistors r1 and r2. For example, if r1 = 1.5 kΩ and r2 = 3.5 kΩ, the reference potential is 0.7×Vdd.

When the input voltage $V_C$ is lower than the reference voltage $V_H$ which is expressed as:

$$r2 \cdot Vdd/(r1+r2),$$

the current mirror circuit 50 produces a high level output. When $V_C$ is higher than $V_H$, it produces a low level output. The input voltage $V_C$ is the output of the lowpass filter 3 which is slowly varied. Thus, the output of the current mirror circuit 50 will slowly vary in the level.

The edge detector 52 receives the output from the current mirror circuit 50 and modulates it to a sharpedged staircase-like waveform with a hysteresis inverter 53 and transfer the signal after inversion by the inverter 54.

Also, the current mirror circuit 51 produces a high level output when the input voltage $V_C$ is lower than a reference voltage $V_L$ which is expressed as:

$$r2' \cdot Vdd/(r1'+r2')$$

Then, it produces a low level output when $V_C$ is higher than $V_L$.

Similarly, the edge detector 56 modulates in waveform the output from the current mirror circuit 51 with the hysteresis inverter 57 and transfer it to the RS flip flop 61. Then the RS flip-flop 61 delivers a high level output when receiving the low level pulse out of the edge detector 52, and the flip-flop 61 delivers a low level output when receiving the low level pulse out of the edge detector 56. And the flip-flop 61 keeps the same level when receiving the high level pulses from both of the edge detectors 52 and 56.

As now understood, the output S of the number of rows selector circuit 17 shown in FIG. 3 becomes a high level when the input voltage $V_C$ is higher than $V_H$ and a low level when $V_C$ is lower than $V_L$. This action is graphically expressed in FIG. 4.

Referring back to FIG. 1, the operation of the first embodiment of the present invention will then be described. It is assumed that just after energization, the control voltage of the lowpass filter 3 remains zero. Then, when the reference signal 6 is fed, the phase comparator 1 delivers a pulse from its $\overline{UP}$ port and thus, the control voltage $V_C$ of the lowpass filter 3 is increased. Subsequently, the voltage controlled oscillator 4a commences oscillation and its oscillation frequency will increase.

When the oscillation frequency needed for synchronization is obtained by applying the control voltage $V_C$ which is lower than the reference potential $V_H$ to the ring oscillator 39a in n-row mode, the PLL arrangement of this embodiment carries out synchronization with the output S of the number of rows selector circuit 17 remaining at low level. When the oscillation frequency needed for synchronization is not obtained with the ring oscillator in n-row mode indicating that the control voltage $V_C$ should be higher than the reference potential $V_H$, the output S of the number of rows selector circuit 17 shifts to a high level so that the ring oscillator 39a can generate oscillation in. When the reference signal lowers in frequency after the synchronization is achieved using m-row of the ring oscillator 39a once, then the control voltage $V_C$ will be declined to the reference voltage $V_L$. When $V_C$ becomes lower than $V_L$, the output S of the number of rows selector circuit 17 drops down to the lower level to trigger oscillation with the n-row of the ring oscillator 39a.

FIG. 18 shows a relation between the oscillation frequency and the control voltage of the voltage controlled oscillator 4a. An arrow sign 1 indicates that the row number of the ring oscillator changes from n to m when rising the reference frequency, conversely an arrow sign 2 indicates that the row number changes from m to n when lowering the reference frequency. In FIG. 18, f1 means the oscillation frequency of the n row at the control voltage $V_H$, while f2 means the oscillation frequency of the m row at the control voltage $V_L$. Then, the n row functions appropriately under the frequency f1, the m row functions over the frequency f2. The condition of frequency f1 > f2 is required for stable operation.

A second embodiment of the present invention will now be described referring to FIGS. 5 to 7.

The entire arrangement of the second embodiment is shown in FIG. 5 comprising a phase comparator 1 for comparison in both phase and frequency between a reference signal 6 and a divider output 8, a charge pump 2 for converting the pulse output of the phase comparator 1 into a current pulse, a lowpass filter 3 for smoothing the current pulse from the charge pump 2 to produce a control voltage output, a voltage controlled oscillator 4a for oscillation at a frequency corresponding to the control voltage from the lowpass filter 3, a divider 5 for dividing an output 7 of the voltage controlled oscillator 4a, a number-of-rows selector circuit 17a which selects the number of row in the ring oscillator, corresponding to the control voltage $V_C$ supplied from the lowpass filter 3, and a synchronism detector 18 for detecting a synchronizing action upon receiving $\overline{UP}$ and $\overline{DOWN}$ signals from the phase comparator 1.

In the arrangement, the phase comparator 1, the charge pump the lowpass filter 3, and the divider 5 are identical to conventional ones shown in FIGS. 12, 13 and 15 respectively. Similarly, the voltage controlled oscillator 4a is the same as arranged in the first embodiment in FIG. 2.

Figure 6:
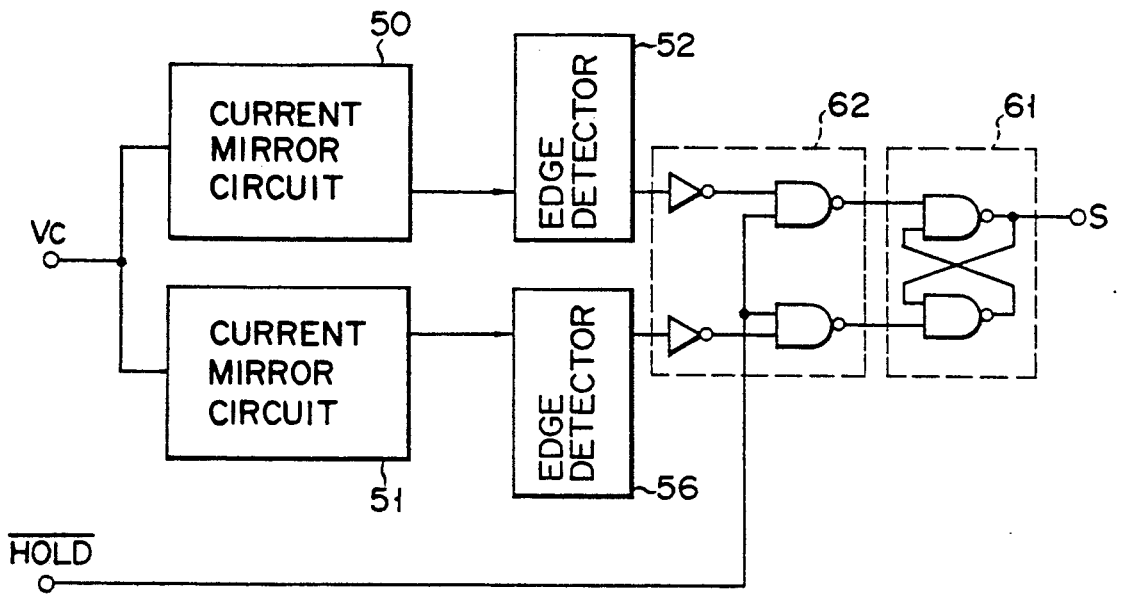
FIG. 6 is a circuit diagram showing a number-of-rows selector employed in the second embodiment.

The number of rows selector 17a is illustrated in FIG. 6 consisting mainly of a pair of current mirror circuits 50 and 51, two edge detectors 52 and 56, and an RS flip-flop 61, all of which being identical to those shown in FIG. 3, except a pulse hold 62 interposed between the RS flip-flop 61 and the two edge detectors 52 and 56.

The pulse holder 62 is arranged to pass pulses generated by the edge detector 52 and 56 to the RS flip-flop 61 when the input signal $\overline{HOLD}$ is at high level and block them when $\overline{HOLD}$ is at low level. The signal $\overline{HOLD}$ is supplied from synchronism detector 18 and goes down to a low level when oscillation at the voltage controlled oscillator 4a enters synchronizing action. If the synchronizing action is detected, the output S of the RS flip-flop 61 is held regardless of outputs of the edge detectors 52 and 56.

Figure 7:
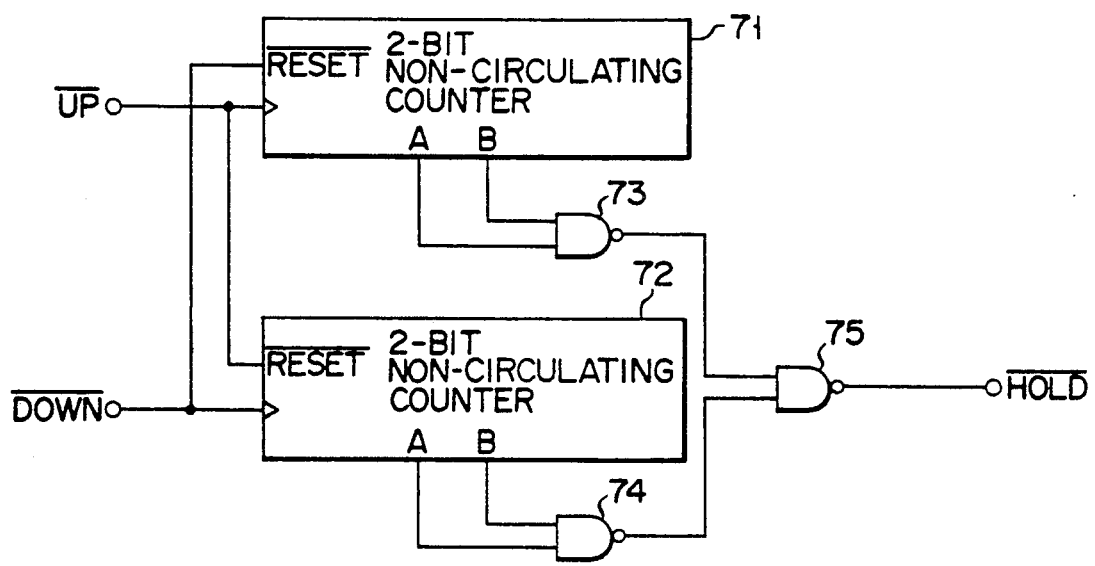
FIG. 7 is a circuit diagram showing a synchronization detector employed in the second embodiment.

As shown in FIG. 7, the synchronism detector 18 consists of a two-bit noncycling counter 71 for receiving $\overline{UP}$ signal of the phase comparator 1 as the clock input and $\overline{DOWN}$ signal as the reset input, another two-bit noncycling counter 72 for receiving $\overline{DOWN}$ signal as the clock input and $\overline{UP}$ signal as the reset input; a 2-input NAND 73 for detecting that both of the outputs A and B of the counter 71 are at high level, a 2-input NAND 74 for detecting that both of the outputs A and B of the counter 72 are at high level, and a 2-input NAND 75 for shifting the $\overline{HOLD}$ output to high level when either the 2-input NAND 73 or 74 delivers a low level output.

Figure 19:
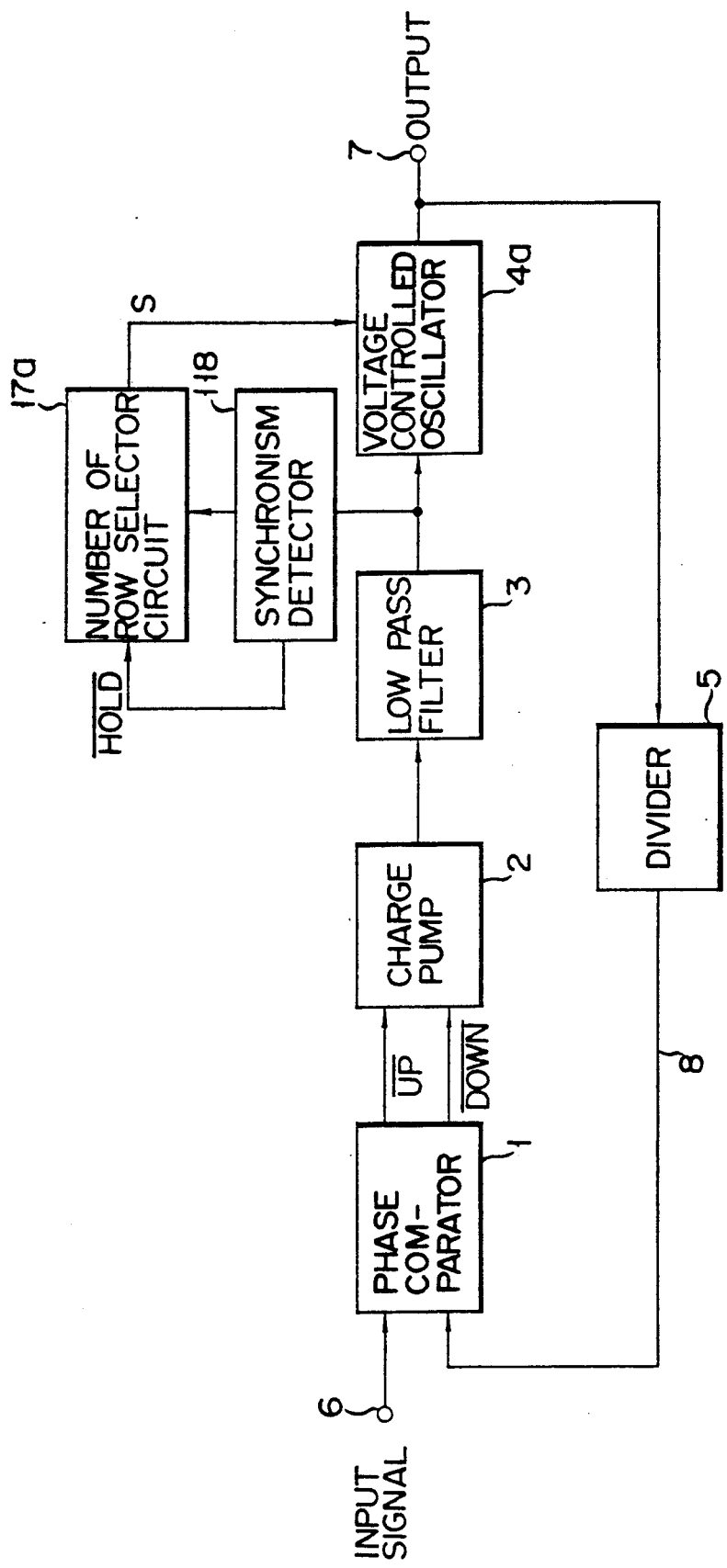
FIG. 19 is a block diagram of a phase locked loop circuit showing a fourth embodiment of the present invention.

Also, FIG. 19 is a block diagram showing the fourth embodiment of the present invention. According to the fourth embodiment, the synchronism detector 18 shown in FIG. 5 is replaced with another detector 118 disposed between the number of row selector 17a, the lowpass filter 3, and the voltage controlled oscillator 4a. In the operation, the signals $\overline{UP}$ and $\overline{DOWN}$ are not directly processed but an accumulation of the phase and frequency difference in the lowpass filter 3 is received as the control voltage $V_C$, which is then processed and fed as $\overline{HOLD}$ signal to the number of rows selector 17a.

The operation of the synchronism detector 18 will then be described. The term "synchronization" means not only coincidence in both phase and frequency between the reference signal 6 and the divider output 8 but also a state in which compensation for phase error is on the way while frequency synchronization has been accomplished more or less.

The 2-bit noncycling counter 71 commences +1 increment operation in response to the rise of the $\overline{UP}$ signal and stops when (A, B) = (1, 1) is obtained. When the $\overline{DOWN}$ signal drops to a low level, reset action initiates (A, B) = (0, 0). Accordingly, the counter 71 delivers (A, B) = (1, 1) if three of the $\overline{UP}$ pulses are supplied in sequence.

Also, the 2-bit noncycling counter 72 commences +1 increment operation in response to the rise of the $\overline{DOWN}$ signal and stops when (A, B) = (1, 1) is obtained. When the $\overline{UP}$ signal drops to a low level, reset action initiates (A, B) = (0, 0). Accordingly, the counter 72 delivers (A, B) = (1, 1) if three of the $\overline{DOWN}$ pulses are supplied in sequence.

The 2-input NAND 75 is arranged to deliver a low level from the $\overline{HOLD}$ output when neither the counters 71 nor 72 supply (A, B) = (1, 1) from the A and B outputs. This explains that neither the $\overline{UP}$ nor $\overline{DOWN}$ pulse is fed three times in a row but they are alternately supplied and the compensation of phase error between the reference signal 6 and the divider output 8 is being carried out while frequency synchronization has nearly been accomplished.

When either the counter 71 or 72 supply (A, B) = (1, 1), the 2-input NAND 75 delivers a high level from the $\overline{\text{HOLD}}$ output. This means that either the $\overline{\text{UP}}$ or $\overline{\text{DOWN}}$ pulse is repeatedly fed three times or more in a row and thus, there is a great difference in the frequency between the reference signal 6 and the divider output 8.

In the foregoing manner, the synchronism detector 5 shown in FIG. 7 can detect the synchronization (or a synchronizing process).

The operation in the second embodiment shown in FIG. 5 will now be described, in which the action just after the initial energization is the same as that of the first embodiment.

As the reference signal 6 and the divider output 8 come approximate to each other in the frequency, the continuous supply of either the $\overline{\text{UP}}$ or $\overline{\text{DOWN}}$ pulses turns to the alternate feeding of both pulses. By now, the synchronism detector 18 keeps the $\overline{\text{HOLD}}$ at a high level and the number of rows selector circuit 17a changes the output S for selecting number of the rows of the ring oscillator in the voltage controlled oscillator 4a.

As synchronization in the PLL proceeds, neither $\overline{\text{UP}}$ nor $\overline{\text{DOWN}}$ pulse is fed more than three times in a row. In other words, the feeding is made in which for example, one $\overline{\text{DOWN}}$ pulse follow two $\overline{\text{UP}}$ pulses. Then, the synchronism detector 18 changes the $\overline{\text{HOLD}}$ to a low level and the output S of the number of rows selector circuit 17a remains held at either high or low level.

As a result, an unstable action which substantially occurs during synchronization with the control voltage $V_C$ of the lowpass filter 3 remaining adjacent to the reference level $V_H$ or $V_L$ can be prevented by the above function of the synchronism detector 18.

Now assume, for example, that $V_C$ is shifted $\Delta V$ by external noise or leakage from the capacitance C of the lowpass filter 3 after the synchronization is achieved in a condition where $V_C$ is a bit lower than $V_H$. If $V_C + \Delta V > V_H$, the number of rows selector circuit in the first embodiment is actuated to shift the output S from a low level to a high level. Because $V_C$ does not turn to an optimum value just after the number of rows in the ring oscillator is switched to another, an undesired frequency which far exceeds the frequency (e.g. n times the frequency of the reference signal 6 if division to 1/n is conducted by the divider 5) defined by the reference signal 6 is released from the voltage controlled oscillator 4a. Consequently, when the PLL is installed in a logic LSI such as a microprocessor, the undesired frequency will cause a fault action in the logic LSI.

According to the second embodiment of the present invention, the number of rows selector is no more activated by a minimal change in $V_C$ after synchronization is achieved, whereby such a fault action as described above will be avoided.

Figure 8:
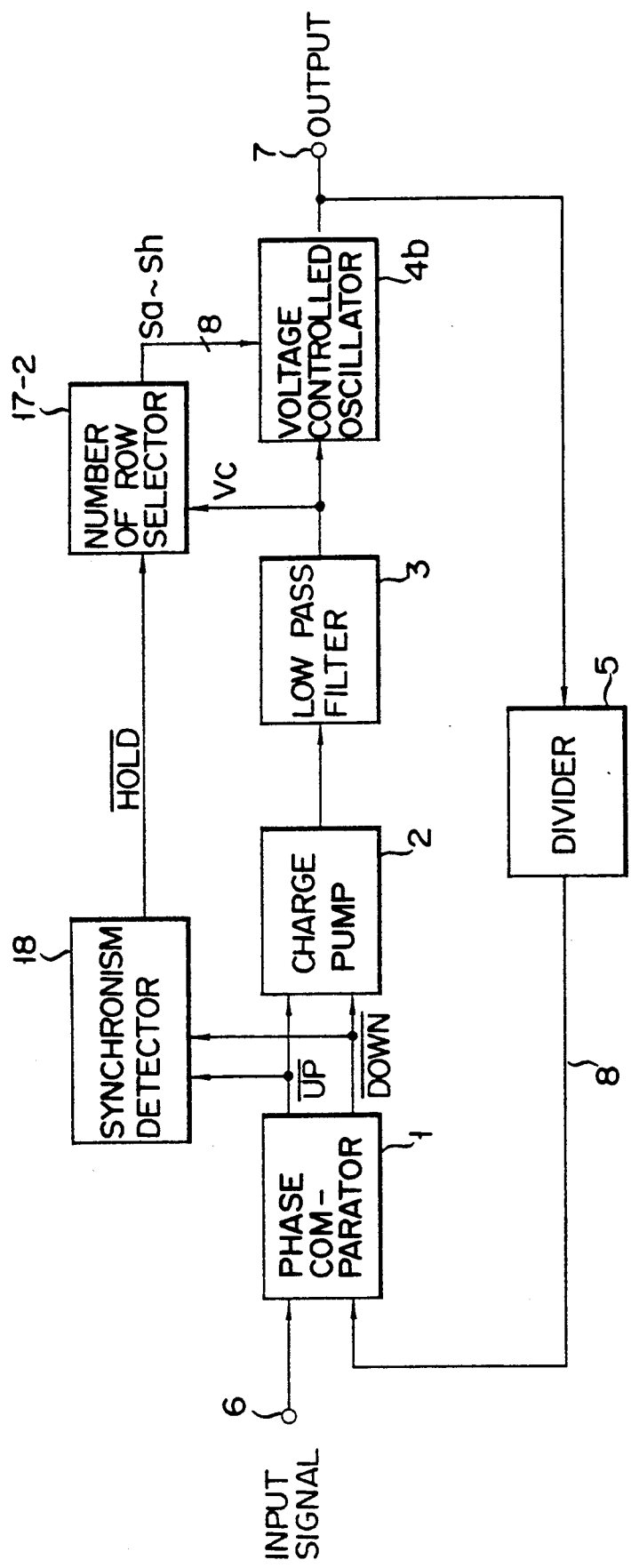
FIG. 8 is a block diagram of a phase locked loop circuit showing a third embodiment of the present invention.

A third embodiment of the present invention will be described referring to FIGS. 8 to 10. FIG. 8 illustrates in which the ring oscillator included in a voltage controlled oscillator 4a similar to that of the second embodiment shown in FIG. 5 contains eight different number of rows of oscillation arrangement for selective control. As a rule, a phase comparator 1, a charge pump 2, a lowpass filter 3, and a divider 4 incorporated in a PLL arrangement shown in FIG. 8 are identical to those shown in FIGS. 12, 13 and 15. A synchronism detector 18 may also be the same as that of the second embodiment shown in FIG. 7.

Figure 9:
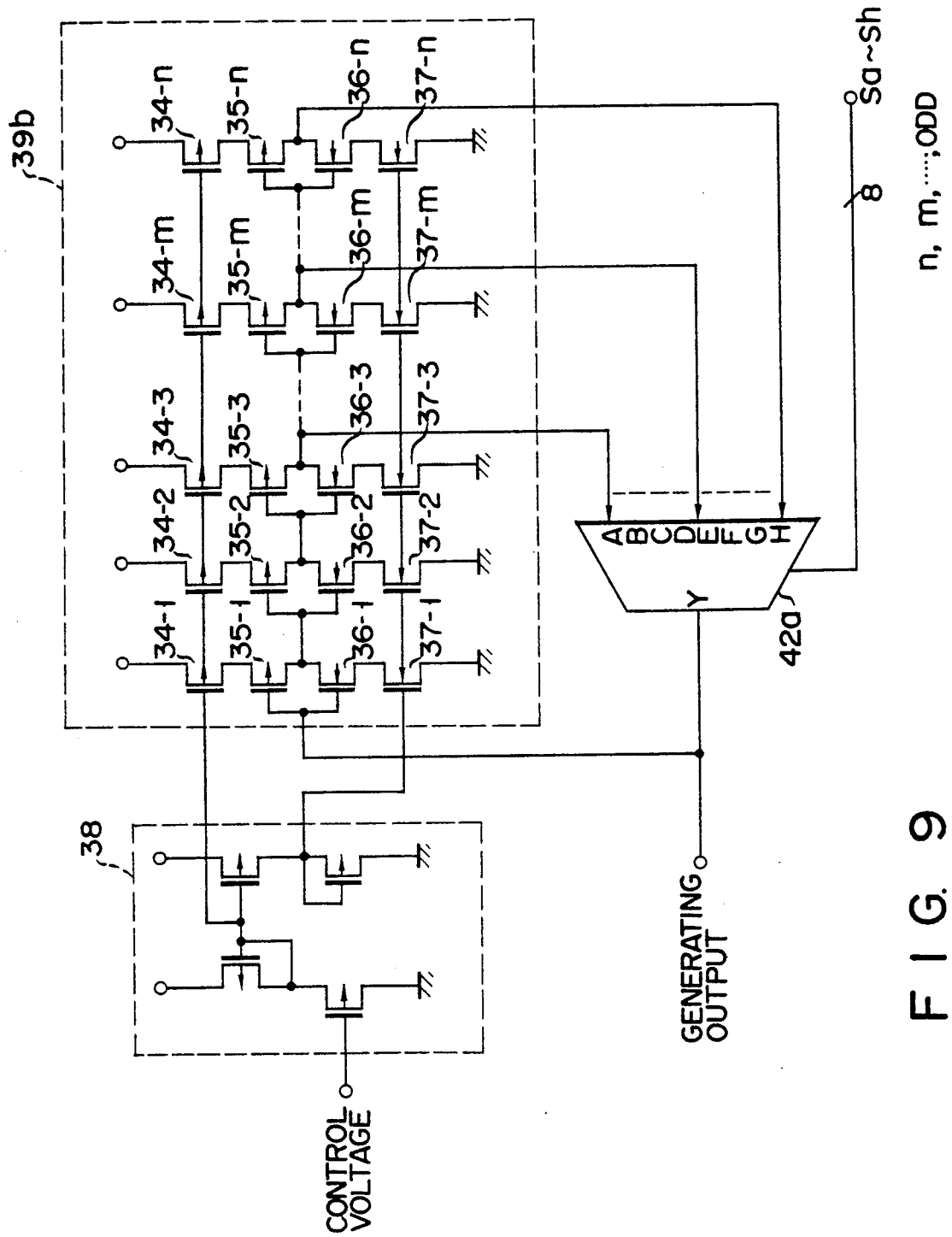
FIG. 9 is a circuit diagram showing a voltage controlled oscillator employed in the third embodiment.
Figure 11:
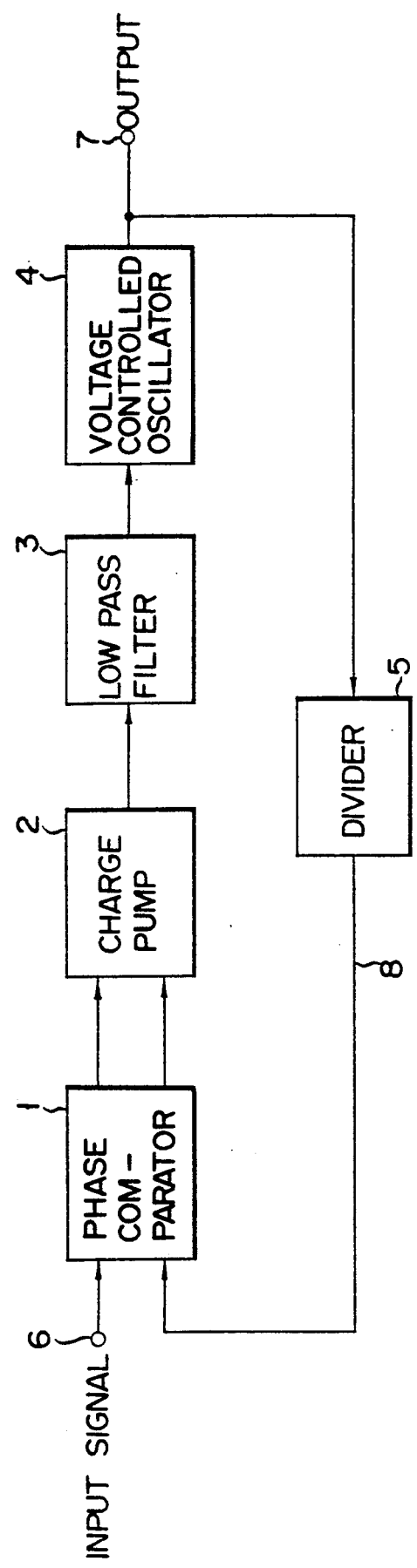
FIG. 11 is a block diagram showing a background art phase locked loop circuit.

A voltage controlled oscillator 4b consists of a buffer amplifier 38, a ring oscillator 39b, and a selector 42a as shown in FIG. 9. The buffer amplifier 38 upon receiving as the control voltage an output from the lowpass filter 3 produces a gate voltage for supply to P-channel transistors 34-1 to 34-n and N-channel transistors 37-1 to 37-n. The ring oscillator 39b is arranged for oscillation at a desired number of rows selected by the selector 42a having 8 inputs.

A number-of-rows selector circuit 17b is provided as shown in FIG. 10. Also, FIG. 20 is a block diagram showing another number-of-rows selector which is simpler in arrangement than that of the third embodiment. In particular, an action of the 2-input NAND 65, the inverter 66, the P-channel transistor 67, and the N-channel transistor 68 is auxiliary in the arrangement of this number of rows selector which is illustratively shown in FIG. 20. As shown, a pair of current mirror circuits 50 and 51 and a pulse hold circuit are arranged in combination to block pulses delivered from edge detectors 52 and 56 while the PLL is in the process of synchronization. An up-down counter 63 is arranged for carrying out +1 increment operation when a pulse is fed to the terminal U and −1 decrement operation when a pulse is fed to the terminal D. If (A, B, C) = (1, 1, 1), no counting is made even when the terminal U receives a pulse. If (A, B, C) = (0, 0, 0), no counting is made even when the terminal D receives a pulse. A decoder 64 is provided for decoding the outputs A, B and C from the up-down counter 63 to a series of row number selecting signals Sa, Sb, ... Sh. The logic table for decoding is expressed as:

$Sa = A \cdot B \cdot C, \ Sb = A \cdot B \cdot \overline{C}, \ Sc = A \cdot \overline{B} \cdot C, \ Sd = A \cdot \overline{B} \cdot \overline{C},$ $Se = \overline{A} \cdot B \cdot C, \ Sf = \overline{A} \cdot B \cdot \overline{C}, \ Sg = \overline{A} \cdot \overline{B} \cdot C, \ Sh = \overline{A} \cdot \overline{B} \cdot \overline{C}$ There are also provided a 2-input NAND 65, an inverter 66, a P-channel transistor 67, and an N-channel transistor 68 which all perform reset action on the control voltage. More particularly, when the control voltage $V_C$ rises more than the reference high level $V_H$ or drops less than the reference low level $V_L$ both of which being determined by their respective current mirror circuits 50 and 51, the pulse at a low level derived from the edge detectors 52 or 56 (if HOLD is high) is transferred to the 2-input NAND 65 which in turn delivers a high level pulse. As a result, the P- and N-channel transistors 67 and 68 are turned on at the same time. When the two transistors 67 and 68 are set substantially low and equal to each other in the "on" resistance, the output $V_C$ of the lowpass filter 3 will be returned to an intermediate potential of $V_H$ and $V_L$ within a short period of time.

As understood, since the control voltage is reset controlled, $V_C$ is reduced under $V_H$, and again $V_C$ would rise over $V_H$ when the number of rows of the ring-oscillator 39b is not reduced enough. In the end, a number of rows of the ring oscillator 39b which allows $V_C$ to fall between $V_H$ and $V_L$ is selected. (It should be noted that another a possibility is anticipated when the frequency of the reference signal is very high or low that the least or greatest number of rows is employed and that $V_C$ remains above $V_H$ or beneath $V_L$.)

The operation in the third embodiment shown in FIG. 8 is similar to that of the second embodiment. The difference from the second embodiment is that as a desired number of the rows are selected from the eight alternatives, changing over from one number to another can trigger the control voltage $V_C$ to return to intermediate voltage potential between $V_L$ and $V_H$ then the selection is done again whether the number of the rows should be increased or decreased further.

As set forth above, the prior art phase locked loop circuit employing a ring oscillator is arranged in which the rows in the ring oscillator are fixed in number according to the maximum frequency and will thus show two drawbacks; unwanted increase in phase jitter caused by an excessively high rate of the gain $\Delta f/\Delta V$ of the voltage controlled oscillator and the unstability of the oscillation in low frequency resulting from long delay in the switching action of the inverters in the ring oscillator.

On the other hand, the present invention allows the optimum number of the rows in the ring oscillator to be automatically selected for output of a specific frequency, whereby the phase jitter will be minimized and also, the unstability of oscillation during low frequency oscillation will be lessened.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A phase locked loop circuit, said circuit arranged for receiving a first signal having a given frequency and producing a second signal which has the same frequency and is synchronous with the first signal, comprising:
   control voltage generating means for generating a control voltage responding to a phase difference and a frequency difference between the first and second signals;
   a voltage controlled oscillator containing a ring oscillator having a multiplicity of quantities of the inverters rows for producing a frequency output which is determined by the control voltage; and
   a quantity-of-rows changing means for automatically changing the quantity of the inverters rows in the ring oscillator responding to the control voltage.

2. A phase locked loop circuit according to claim 1, wherein said control voltage generating means comprises:
   a phase comparator for producing through comparing the first signal with the second signal fed back from the output a pulse of a phase difference signal between the first and second signals;
   a charge pump for converting the phase difference signal pulse into a current pulse;
   a lowpass filter for converting the current pulse into a DC voltage;
   said voltage controlled oscillator containing a ring oscillator having an odd number of quantity of the inverters rows coupled in cascade for producing the second signal having said frequency when receiving the control voltage; and
   said quantity of rows selector being arranged for automatically selecting a quantity of the inverters rows in the ring oscillator according to the control voltage.

3. A phase locked loop circuit according to claim 2, wherein said phase comparator produces through comparing between the first and second signals an UP and a DOWN signal carrying information about a phase difference.

4. A phase locked loop circuit according to claim 2, wherein said charge pump contains an inverter.

5. A phase locked loop circuit according to claim 2, wherein said lowpass filter contains a capacitor and a resistor.

6. A phase locked loop circuit according to claim 1, further comprising a divider for dividing by an integer the second signal received to a divided output which is then fed to the phase comparator.

7. A phase locked loop circuit according to claim 6, wherein said divider contains a D-type flip-flop.

8. A phase locked loop circuit according to claim 1, wherein said quantity of inverters rows selector is arranged to feed an output from the inverter of a given row in the ring oscillator back to the input of the first row of the ring oscillator in response to the control voltage.

9. A phase locked loop circuit according to claim 8, wherein said quantity of inverters rows selector contains a first current mirror circuit for comparing the control voltage with a first reference potential and a second current mirror circuit for comparing the control voltage with a second reference potential which is lower than the first reference potential so that the quantity of the inverters rows can automatically be changed according to a result from the comparison.

10. A phase locked loop circuit according to claim 3, further comprising a synchronism detector provided between the output of the phase comparator and the quantity of inverters rows selector for judging whether synchronization is detected or not upon receiving UP and DOWN signals from the phase comparator, and if synchronization is detected, feeding to the quantity of inverters rows selector a stop signal for stopping the change of the quantity of the inverters rows.

11. A phase locked loop circuit according to claim 3, further comprising a synchronism detector provided between the lowpass filter and the quantity of inverters rows selector for judging whether synchronization is detected or not upon receiving the control signal from the lowpass filter and if synchronization is detected, feeding to the quantity of inverters rows selector a stop signal for stopping the change of the quantity of the inverters rows.

12. A phase locked loop circuit according to claim 10, wherein said synchronism detector contains one of 2-bit noncycling counter for accepting the UP signal from the phase comparator as a clock input and the DOWN signal as a reset input, and another counter for accepting the UP signal as reset input and DOWN signal as a clock input.

13. A phase locked loop circuit according to claim 1, wherein said quantity of inverters rows selector is arranged to select two or more different quantity of the inverters rows in the ring oscillator according to a value of the control voltage.

14. A phase locked loop circuit according to claim 13, wherein said quantity of inverters rows selector contains a couple of current mirror circuits for receiving the control voltage, an up-down counter for counting the outputs of the current mirror circuits for providing a count output, and a decoder for decoding the count output to produce a decoder output by which more than two different quantities of the inverters rows in the ring oscillator are selected.

15. A phase locked loop circuit according to claim 14, wherein said decoder is arranged to deliver an 8-bit signal to the quantity of inverters rows selector which in turn selects one from eight kinds of quantities of the inverters rows in the ring oscillator.

16. A phase locked loop circuit said circuit arranged for receiving a first signal having a given frequency and producing a second signal which has the same frequency and is synchronous with the first signal, comprising:

control voltage generating means for generating a control voltage responding to a phase difference and a frequency difference between the first and second signals;

a voltage controlled oscillator containing a ring oscillator having a multiplicity of quantities of inverters rows for producing a frequency output which is determined by the control voltage;

a quantity-of-rows changing means for automatically changing the quantity number of the inverters rows in the ring oscillator responding to the control voltage;

a divider for dividing by an integer the second signal supplied to a divided output which is then fed to the phase comparator;

said control voltage generating means comprising a phase comparator for producing through comparing the first signal with the second signal fed back from the output a pulse of a phase difference signal between the first and second signals, a charge pump for converting the phase difference signal pulse into a current pulse, and a lowpass filter for converting the current pulse into a DC voltage;

said voltage controlled oscillator containing a ring oscillator having an odd number of quantity of inverters rows coupled in cascade for producing the second signal having said frequency when receiving the control voltage; and said quantity of rows selector being arranged for automatically selecting a quantity of the inverters rows in the ring oscillator according to the control voltage.

17. A phase locked loop circuit, said circuit arranged for receiving a first signal having a given frequency and producing a second signal which has the same frequency and is synchronous with the first signal, comprising:

control voltage generating means for generating a control voltage responding to a phase difference and a frequency difference between the first and second signals;

a voltage controlled oscillator containing a ring oscillator having a multiplicity of the quantities of inverters rows for producing a frequency output which is primarily determined by the control voltage;

a quantity-of-rows changing means for automatically changing the quantity of the inverters rows in the ring oscillator responding to the control voltage;

a divider for dividing by an integer the second signal supplied to a divided output which is then fed to the phase comparator;

said control voltage generating means comprising a phase comparator for producing through comparing the first signal with the second signal fed back from the output a pulse of a phase difference signal between the first and second signals, a charge pump for converting the phase difference signal pulse into a current pulse, and a lowpass filter for converting the current pulse into a DC voltage;

said voltage controlled oscillator containing a ring oscillator having an odd number of quantity of inverters rows coupled in cascade for producing the second signal having said frequency when receiving the control voltage; and said quantity of rows selector being arranged for receiving the control voltage and automatically selecting a quantity of the inverters rows in the ring oscillator according to the said frequency by means of feedback of an output from the inverter of a given row in the ring oscillator to the input of the first row of the ring oscillator.

18. A phase locked loop circuit, said circuit arranged for receiving a first signal having a given frequency and producing a second signal which has the same frequency and is synchronous with the first signal, comprising:

control voltage generating means for generating a control voltage presenting a phase difference and frequency difference between the first and second signals;

a voltage controlled oscillator containing a ring oscillator having a multiplicity of quantities of the inverters rows for producing a frequency output which is determined by the control voltage;

a quantity-of-rows changing means for automatically changing the quantity of the inverters rows in the ring oscillator responding to the control voltage;

a divider for dividing by an integer the second signal supplied to a divided output which is then fed to the phase comparator;

a synchronism detector interposed between the output of the phase comparator and the quantity of inverters rows selector for judging whether synchronization is detected or not upon receiving UP and DOWN signals from the phase comparator and if synchronization is detected, feeding to the quantity of rows selector a stop signal for stopping the change of the quantity of the inverters rows;

said control voltage generating means comprising a phase comparator for producing through comparing the first signal with the second signal fed back from the output a pulse of a phase difference signal between the first and second signals, a charge pump for converting the phase difference signal pulse into a current pulse, and a lowpass filter for converting the current pulse into a DC voltage;

said voltage controlled oscillator containing a ring oscillator having an odd number of quantity of inverters rows coupled in cascade for producing the second signal having said frequency when receiving the control voltage; and said quantity of inverters rows selector being arranged for receiving the control voltage and automatically selecting a quantity of the inverters rows in the ring oscillator according to said frequency by means of feedback of an output from the inverter of a given row in the ring oscillator to the input of the first row of the ring oscillator.

* * * * *